US 7,449,280 B2
Nov. 11, 2008

(12) United States Patent
Johnson et al.

(54) PHOTOIMAGEABLE COATING COMPOSITION AND COMPOSITE ARTICLE THEREOF

(75) Inventors: Donald W. Johnson, Wayland, MA (US); William D. Weber, Rumford, RI (US); Pamela J. Waterson, Northbridge, MA (US); Vincent R. Urdi, Raynham, MA (US); Joseph R. Molea, Woburn, MA (US); Thomas Roger Strand, Corvallis, OR (US)

(73) Assignees: MicroChem Corp., Newton, MA (US); Hewlett-Packard Development Company, LP, Houston, TX (US)

(*) Notice: Subject to any disclaimer, the term of this patent is extended or adjusted under 35 U.S.C. 154(b) by 5 days.

(21) Appl. No.: 10/945,334

(22) Filed: Sep. 20, 2004

(65) Prior Publication Data

US 2005/0266335 A1    Dec. 1, 2005

(51) Int. Cl.
*G03F 7/04* (2006.01)
*G03F 7/09* (2006.01)
*G03F 7/11* (2006.01)
*G03F 7/039* (2006.01)
*G03F 7/40* (2006.01)

(52) U.S. Cl. .................. 430/280.1; 522/140; 430/325; 430/330

(58) Field of Classification Search .................. None
See application file for complete search history.

(56) References Cited

U.S. PATENT DOCUMENTS

| | | | |
|---|---|---|---|
| 3,469,982 A | 9/1969 | Celeste | 97/35.1 |
| 3,708,296 A | 1/1973 | Schlesinger | 96/33 |
| 3,782,939 A | 1/1974 | Bonham et al. | 96/35.1 |
| 4,193,797 A | 3/1980 | Cohen et al. | 430/258 |
| 4,193,799 A | 3/1980 | Crivello | 430/319 |
| 4,247,616 A | 1/1981 | Vikesland et al. | 430/192 |
| 4,256,828 A | 3/1981 | Smith | 430/280 |
| 4,565,859 A | 1/1986 | Murai et al. | 528/365 |
| 4,576,902 A | 3/1986 | Saenger et al. | 430/326 |
| 4,624,912 A | 11/1986 | Zweifel et al. | 430/258 |
| 4,672,020 A | 6/1987 | Koelsch et al. | 430/166 |
| 4,841,017 A | 6/1989 | Murai et al. | 525/2 |
| 4,940,651 A * | 7/1990 | Brown et al. | 430/325 |
| 5,026,624 A | 6/1991 | Day et al. | 430/280 |
| 5,043,221 A | 8/1991 | Koleske | 428/413 |
| 5,077,174 A | 12/1991 | Bauer et al. | 430/270 |
| 5,102,772 A | 4/1992 | Angelo et al. | 430/280 |
| 5,120,633 A | 6/1992 | Bauer et al. | 430/176 |
| 5,145,764 A | 9/1992 | Bauer et al. | 430/260 |
| 5,229,252 A * | 7/1993 | Flynn et al. | 430/280.1 |
| 5,262,281 A | 11/1993 | Bauer et al. | 430/323 |
| 5,264,325 A | 11/1993 | Allen et al. | 430/280 |
| 5,278,010 A | 1/1994 | Day et al. | 430/18 |
| 5,304,457 A | 4/1994 | Day et al. | 430/280 |
| 5,335,004 A | 8/1994 | Matsuhisa | 347/44 |
| 5,405,731 A | 4/1995 | Chandrasekaran et al. | 430/260 |
| 5,494,943 A | 2/1996 | Mahoney et al. | 522/66 |
| 5,502,083 A | 3/1996 | Abe et al. | 522/31 |
| 5,665,650 A | 9/1997 | Lauffer et al. | 216/20 |
| 5,726,216 A | 3/1998 | Janke et al. | 522/31 |
| 5,859,655 A | 1/1999 | Gelorme et al. | 347/65 |
| 5,969,736 A | 10/1999 | Field et al. | 347/85 |
| 6,062,681 A | 5/2000 | Field et al. | 347/65 |
| 6,066,889 A | 5/2000 | Jones et al. | 257/698 |
| 6,096,796 A * | 8/2000 | Watanabe et al. | 522/100 |
| 6,193,359 B1 | 2/2001 | Patil et al. | 347/65 |
| 6,204,456 B1 | 3/2001 | Lauffer et al. | 174/262 |
| 6,291,140 B1 | 9/2001 | Andreoli et al. | 430/322 |
| 6,305,790 B1 | 10/2001 | Kawamura et al. | 347/65 |
| 6,368,769 B1 | 4/2002 | Ohkawa et al. | 430/270.1 |
| 6,375,313 B1 | 4/2002 | Adavikolanu et al. | 347/63 |
| 6,391,523 B1 | 5/2002 | Hurditch et al. | 430/280.1 |
| 6,419,346 B1 | 7/2002 | Nikkel | 347/63 |
| 6,447,102 B1 | 9/2002 | Chen et al. | 347/63 |
| 6,462,107 B1 | 10/2002 | Sinclair et al. | 523/456 |
| 6,506,989 B2 | 1/2003 | Wang | 200/181 |
| 6,528,218 B1 | 3/2003 | Foster et al. | 430/14 |
| 6,544,902 B1 | 4/2003 | Farnworth | 438/781 |
| 6,576,478 B1 | 6/2003 | Wagner et al. | 436/518 |
| 6,582,890 B2 | 6/2003 | Dentinger et al. | 430/322 |

(Continued)

OTHER PUBLICATIONS

Licari et al, Handbook of Polymer Coatings for Electronics, pp. 196-225, year 1990, Noyes Publications, Park Ridge, New Jersey, USA, from KNOVEL online database.*

(Continued)

*Primary Examiner*—Cynthia Hamilton
(74) *Attorney, Agent, or Firm*—Todd E. Garabedian; Wiggin and Dana LLP

(57) ABSTRACT

A photoimagable composition suitable for use as a negative photoresist comprising:
(A) at least one epoxidized polyfunctional bisphenol A formaldehyde novolak resin;
(B) at least one polycaprolactone polyol reactive diluent, wherein the amount of component (A) is from about 95% to about 75% by weight of the sum of (A) and (B) and the amount of component (B) is from about 5% to about 25% by weight of the sum of (A) and (B);
(C) at least one photoacid generator in an amount from about 2.5 to about 12.5 parts per hundred parts of resin and reactive diluent, which initiates polymerization upon exposure to actinic radiation; and
(D) a sufficient amount of solvent to dissolve (A), (B) and (C);
wherein the solvent comprises 2-pentanone, 3-pentanone, and 1,3-dioxolane and mixtures thereof.

13 Claims, No Drawings

U.S. PATENT DOCUMENTS

| | | | |
|---|---|---|---|
| 6,624,730 B2 | 9/2003 | Johnson et al. | 335/78 |
| 6,645,432 B1 | 11/2003 | Anderson et al. | 422/100 |
| 6,652,878 B2 | 11/2003 | Webb et al. | 424/450 |
| 6,663,615 B1 | 12/2003 | Madou et al. | 604/891.1 |
| 6,670,129 B2 | 12/2003 | Webb | 435/6 |
| 6,674,350 B2 | 1/2004 | Hirose et al. | 335/256 |
| 6,682,942 B1 | 1/2004 | Wagner et al. | 436/518 |
| 6,716,568 B1 * | 4/2004 | Minsek et al. | 430/280.1 |
| 2002/0076651 A1 * | 6/2002 | Hurditch et al. | 430/280.1 |
| 2003/0059344 A1 | 3/2003 | Brady et al. | 422/100 |

OTHER PUBLICATIONS

N. LaBianca and J.D. Gelorme, "*High Aspect Ratio Resist for Thick Film Applications*", SPIE vol. 2438, pp. 846-852, Jun. 1995: Date of Publication.

J.V. Crivello and H.H.W. Lam, "*Photoinitiated Cationic Polymerization with Trlarysulfonium Salts*", Journal of Polymer Science: Polymer Chemistry Edition, vol. 17, pp. 977-999, 1979.

\* cited by examiner

PHOTOIMAGEABLE COATING COMPOSITION AND COMPOSITE ARTICLE THEREOF

BACKGROUND OF THE INVENTION

1. Field of the Invention

This invention relates to photoimageable epoxy resin coating compositions and composite articles of dry film photoresist made using the said compositions that are useful in the fabrication of electronic components, micro-electromechanical system (MEMS) components, micromachine components, microfluidic components, micro total analysis system (μ-TAS) components, microreactor components, electroconductive layers, lithographie, galvanoformung, abformung (LIGA) components, forms and stamps for microinjection molding and microembossing, screens or stencils for fine printing applications, MEMS and electronic packaging components, and printed wiring boards that can be processed by ultraviolet (UV) lithography. Suitable electronic component applications include dielectric layers, insulation layers, and photoconductive wave circuits. Other uses include resin substrates for other photoimageable layers and in the construction of array structures for biochemical analysis and in the construction of cell growth platforms for biological materials. Still other suitable applications may include the fabrication of buried channel and air-bridge structures used, for example, in microfluidic or optical devices.

2. Brief Description of Art

Photoimageable coatings are currently used in a wide variety of semiconductor and micromachining applications. In such applications, photoimaging is accomplished by exposing the coating on a substrate to patterned radiation thereby inducing a solubility change in the coating such that the exposed or unexposed regions can be selectively removed by treatment with a suitable developer composition. The photoimageable coating (photoresist) may be either of the positive or negative type, where exposure to radiation either respectively increases or decreases the solubility in the developer.

The most common photoimageable coatings useful in microelectronic applications are liquid compositions comprising a film forming resin, a photoactive compound, and a solvent. These compositions may be applied to a substrate either directly in liquid form and then dried to form a coating on the substrate or they may be first formed into a composite film comprising a substantially dried coating of the liquid resist on a carrier film such that when the coated side of the composite film is contacted with the substrate under the action of heat and pressure, the photoimageable coating is adhered to the substrate and the carrier film is then removed leaving the photosensitive layer on the substrate. Photoimageable composite films of the type described are commonly referred to in the art as dry film photoresists. Depending on the application, dry film photoresists may offer advantages over liquid photoresists especially when the coated substrate is not compatible with the solvents present in the liquid resist or when the substrate, either for technical or economic reasons, cannot be baked under the conditions of time and temperature necessary to remove the solvent.

Conventional positive resists based on diazonaphthoquinone-novolac chemistry are not well-suited to applications requiring film thicknesses greater than about 10 microns. This thickness limitation is caused by the relatively high optical absorbance of the diazonaphthaquinone-type (DNQ) photoactive compounds at wavelengths in the near-ultraviolet region of the optical spectrum (350-450 nm) which are typically used to expose the resist. Also, DNQ-type photoresists possess limited contrast, or differential solubility, of the exposed vs. unexposed resist in a developer solution which results in relief image sidewalls that are sloped rather than vertical. Optical absorption necessarily reduces the radiation intensity as radiation traverses from the top to the bottom of the film, such that if the optical absorption is too high, the bottom of the film will be underexposed relative to the top, causing a sloped or otherwise distorted profile of the developed image. Nevertheless, DNQ resist formulations are available for use at film thicknesses up to 100 microns, but at a great increase in the required exposure dose.

A negative, spin-coated, thick-film photoimageable composition of the chemically amplified type, which has a very low optical absorbance at wavelengths in the 350-450 nm range has been described in the literature [N. LaBianca and J. D. Gelorme, "High Aspect Ratio Resist for Thick Film Applications", Proc. SPIE, vol. 2438, p. 846 (1995)]. High aspect ratio (>10:1) photoimaging was demonstrated in 200 micron thick films. This resist comprises a solution in a casting solvent of a highly branched, multifunctional epoxy bisphenol A-novolac resin, EPON® SU-8 from Resolution Performance Products, and a photoacid generator (PAG) such as CYRACURE® UVI 6974 from Dow Chemical which consists of a mixture of arylsulfonium hexafluoroantimonate salts. The resulting photoresist formulation may be spin coated or curtain coated onto a wide variety of substrates, pre-baked to evaporate solvent, leaving a solid photoresist coating of one hundred microns or greater thickness which may be photoimaged by exposure to near-ultraviolet radiation through a patterned photomask using contact, proximity, or projection exposure methods. Subsequent immersion of the imaged layer in a developer solution dissolves away the unexposed regions, leaving behind a high resolution, negative-tone relief image of the photomask in the film.

EPON® SU-8 resin is a low molecular weight, multifunctional epoxy oligomer that has several characteristics making it advantageous for high aspect ratio photoimaging in thick films: (1) it has a high average epoxide functionality, (2) a high degree of branching, (3) high transparency at wavelengths of 350-450 nm, and (4) the molecular weight is sufficiently low as to allow preparation of high solids coating compositions. The high functionality and branching result in efficient crosslinking under the influence of strong acid catalysts, while the high transparency allows uniform irradiation through thick films, making the resist capable of forming images with aspect ratio of greater than 10:1 at film thicknesses of greater than 100 microns. In fact, only high epoxy functionality and a high degree of branching will provide high aspect ratio structures with straight sidewalls.

Suitable photoacid generators based on sulfonium or iodonium salts are well-known and have been extensively discussed in the literature [see for ex. Crivello et al., "Photoinitiated Cationic Polymerization with Triarylsulfonium Salts", Journal of Polymer Science: Polymer Chemistry Edition, vol. 17, pp. 977-999 (1979).] Other useful PAGs with appropriate absorbance include the carbonyl-p-phenylene thioethers as described in U.S. Pat. Nos. 5,502,083 and 6,368,769. Additionally, sensitizers such as 2-alkyl-9,10-dimethoxyanthracenes or various naphthalene, peryl or pyryl compounds can be added to the formulation or incorporated into the PAG as described in U.S. Pat. No. 5,102,772.

Negative photoresists based on the above disclosed compositions which are suitable for spin-coating are sold by MicroChem Corp., Newton, Mass., USA and are used commercially, especially in the fabrication of MEMS devices. For example, a product typically offered by MicroChem, "SU-8 50" can be spin-coated at 1000-3000 rpm to produce films of thickness in the range of 30-100 microns, which after exposure and development; can produce images having an aspect ratio greater than 10:1 at film thicknesses greater than 100 microns. Higher or lower solids versions extend the film thickness range obtainable by a single coat process to less than 1 micron and above 200 microns. Casting of the solution can result in films of 1 to 2 mm or more in thickness.

U.S. Pat. No. 6,391,523 assigned to MicroChem Corp. discloses a composition useful for a thick film negative resist comprising a mixture of at least one epoxidized polyfunctional bisphenol A formaldehyde novolak resin and at least one photoacid generator in a coating solvent, a majority amount of said coating solvent being cyclopentanone and suitable co-solvents being dimethylformamide, N-methyl pyrrolidinone, ketonic solvents such as, cyclohexanone, heptanone, methylamyl ketone and methyl isopropyl ketone, cyclic ethers such as 1,3-dioxolane and tetrahydofuran, hydroxylic polar solvents such as tetrahydrofurfuryl alcohol, ethyl lactate, propyleneglycol methylether, propyleneglycol methylether acetate, methylmethoxy propionate, 2-ethoxyethyl acetate, propylene carbonate, 2-methoxyethanol, ethylethoxypropionate and the like.

U.S. Pat. No. 6,716,568 assigned to MicroChem Corp., which issued on Apr. 6, 2004 discloses a photoimagable composition suitable for use as a negative photoresist comprising about 75% to about 95% by weight of at least one epoxidized polyflnctional bisphenol A formaldehyde novolak resin; about 5% to about 25% by weight of at least one polyol reactive diluent; and at least one photoacid generator in the amount from about 2.5 to about 12.5 parts per hundred parts of resin and reactive diluent; dissolved in a sufficient amount of a casting solvent. The named casting solvents include gamma-butyrolactone, cyclopentanone, propylene glycol methyl ether acetate, cyclohexanone and methyl ethyl ketone. The preferred polyol reactive diluent is a polycaprolactone polyol.

U.S. Pat. Nos. 4,882,245 and 4,940,651 disclose a photoimageable cationically polymerizable composition for use in printed circuit boards which consists of a mixture of up to 88% epoxidized bisphenol A formaldehyde novolac resin with average epoxide functionality of eight and a reactive diluent which serves as a plasticizer, and a cationic photoinitiator. Reactive diluents disclosed were mono- or di-functional cycloaliphatic epoxides, preferably at 10-35% by weight solids. Also disclosed are the use of these formulations as permanent layers, where the layer is not removed from the substrate, but becomes a part of the structure, such as a dielectric layer on a printed circuit board.

U.S. Pat. Nos. 5,026,624, 5,278,010, and 5,304,457 disclose a photoimageable, cationically polymerizable fire retardant composition suitable for use as a solder mask, which consists of a mixture of the 10-80% by weight condensation product of bisphenol A and epichlorohydrin, 20-90% by weight of epoxidized bisphenol A formaldehyde novolac resin, and 35-50% by weight of epoxidized glycidyl ether of tetrabromobisphenol A, with 0.1-15 parts per hundred by weight of a cationic photoinitiator. Curtain coating, roll coating, and wound wire rod coating were used as methods of coating.

U.S. Pat. No. 4,256,828 discloses a photopolymerizable composition based on an epoxy resin of functionality greater than 1.5, a hydroxyl-containing additive, and a photoacid generator. The hydroxyl-containing additive is reported to increase flexibility and decrease shrinkage for coatings of up to 100 microns thickness.

U.S. Pat. No. 5,726,216 describes a toughened epoxy resin system and the methods for making and using such a system in electron beam radiation curable applications. The main difficulty they claim to overcome is the brittleness of the radiation cured epoxy resins where the resins for many structural, non-structural or other consumer products must have sufficient toughness and impact resistance to endure many years of harsh service. They disclose a wide variety of toughening agents that can be incorporated into the base epoxy resin or mixture, which may include SU-8 resin. Effectiveness of the claimed invention with respect to increased toughness was measured by fracture toughness and flexural modulus. The toughening agents claimed constitute a variety of thermoplastics, hydroxy-containing thermoplastic oligomers, epoxy-containing thermoplastic oligomers, reactive flexibilizers, elastomers, rubbers, and mixtures thereof. However, the compositions of U.S. Pat. No. 5,726,216 were formulated as coatings imaged with non patterned electron beam radiation and no reference was made to the photoimaging characteristics of these formulations when exposed to imaged ultraviolet, X-ray, or electron beam radiation.

There have been many other prior art proposals for different photoimageable compositions including many that use epoxies. Examples of these can be found as referenced in U.S. Pat. No. 5,264,325. Here it is further taught that the resist material must be formulated such that it can be applied by coating methods, for example spin coating, which requires certain rheological properties. In addition, the composition must have the properties of providing sufficient transmission of the exposing radiation so as to photolyze the photoinitiator through the thickness of the film, and the resist must possess appropriate physical and chemical properties to withstand the application, such as solder or ink resistance or toughness, without significant degradation, or loss of adhesion. If it is to be used for other purposes, such as an etch photoresist, other properties may be required.

U.S. Pat. No. 4,882,245 also describes the application of these materials as a dry film photoresist when coated onto a carrier medium such as Mylar film. Numerous other U.S. patents and other references teach the preparation and use of dry film photoresists. The U.S. patents include U.S. Pat. Nos. 3,496,982; 3,782,939; 4,193,797; 4,193,799; 4,247,616; 4,576,902; 4,624,912; 4,672,020; 5,077,174; 5,120,633; 5,145,764; 5,262,281; 5,405,731; 6,066,889; 6,204,456; 6,462,107; and 6,528,218.

Generally, dry film photoresist compositions are made from a liquid photoimagable composition which is coated onto a first substrate using one of several conventional coating techniques. A substantial portion of the solvent in the liquid photoimagable composition is removed by heating or other suitable processing to form a dry film photoresist layer on the first substrate. Later, the dry film is imaged and developed according to conventional processing either on this first substrate or after being transferred onto a second substrate. These imaged and dry films can be then removed from that substrate by conventional stripping or resist removal processing (in which case this resist layer is a temporary resist) or hardened and caused to become part of the end use application (in which case this resist layer is a permanent resist).

While these numerous references teach various resist formulations, there is still a need for better resist formulations for modem dry films applications, including those useful in the microfluidic device field. The present invention offers a solution to that need for those better resists for those modem day film applications.

BRIEF SUMMARY OF THE INVENTION

This invention relates to photoimageable epoxy resin coating compositions and composite articles of dry film photoresist made using the said compositions that are useful in the fabrication of electronic components, micro-electromechanical system (MEMS) components, micromachine components, microfluidic components, micro total analysis system (μ-TAS) components, microreactor components, electroconductive layers, lithographie, galvanoformung, abformung (LIGA) components, forms and stamps for microinjection molding and microembossing, screens or stencils for fine printing applications, MEMS and electronic packaging components, and printed wiring boards that can be processed by ultraviolet (UV) lithography. Suitable electronic component applications include dielectric layers, insulation layers, and photoconductive wave circuits. Other suitable applications include resin substrates for other photoimageable layers, and in the construction of structures for the separation, analysis, and preparation of biological materials such as array structures for biochemical analysis and cell growth platforms. Still other suitable applications may include the fabrication of buried channel and air-bridge structures used, for example, in microfluidic or optical devices.

Therefore, one aspect of the present invention is directed to photoimageable coating compositions useful as a negative photoresist comprising:

(A) at least one epoxidized polyfunctional bisphenol A formaldehyde novolac resin;

(B) at least one polycaprolactone polyol reactive diluent, wherein the amount of component (A) is from about 95% to about 75% by weight of the sum of (A) and (B) and the amount of component (B) is from about 5% to about 25% by weight of the sum of (A) and (B);

(C) at least one photoacid generator in an amount from about 2.5 to about 12.5 parts per hundred parts of resin (A) and reactive diluent (B), which initiates polymerization upon exposure to actinic radiation; and (D) a sufficient amount of at least one solvent to dissolve (A), (B) and (C); wherein the solvent comprises 2-pentanone, 3-pentanone, and 1,3-dioxolane, and mixtures thereof.

Still another aspect of the present invention is directed to a method of forming a dry film photoresist composite comprising the steps of:

(1) applying the above-noted photoimageable coating composition to a polymer film substrate;

(2) evaporating substantially all of the solvent by heating the coated substrate to form a substantially dry film of the photoimageable composition of the polymer film substrate; and (3) applying a protective cover film to the opposite surface of the film.

Another aspect of the present invention is directed to composite articles made by the process shown above using the compositions of the present invention. This dry film photoresist composite comprises a substantially dried coating of the photoimageable composition coated on a flexible carrier film and covered with a protective polymer film. Substantially dry means that most of the volatile materials in the casting solution have been removed by baking the coating in a suitable oven using conditions sufficient to provide a coating with a residual volatiles content of between 0.1% and 2.5% by weight. More preferred is residual volatiles content of between 0.5% and 2.0% by weight and a most preferred residual volatiles content is between 0.5% and 1.5% by weight.

Yet another aspect of the present invention is directed to a method of forming a photoresist pattern using the composite article of dry film photoresist comprising the process steps of: (1) removing the protective coating from the dry film photoresist composite, leaving the photoresist layer attached to the polymer film substrate; (2) laminating the dry film photoresist coating to a second substrate; (3) removing the polymer film substrate from the laminated dry film layer of photoresist on the second substrate; (4) image-wise irradiating the coated second substrate with actinic radiation or electron beam radiation; (5) crosslinking the irradiated areas of the dry film layer of photoresist by heating; (6) developing an image in the dry film layer with a solvent, thereby forming a negative relief image in the dry film photoresist layer; and (7) optionally, further crosslinking the developed relief image by heating.

DETAILED DESCRIPTION OF THE INVENTION

Description of the Photoimageable Coating Composition

The photoimageable coating composition of the present invention is comprised of: (A) at least one epoxidized polyfunctional bisphenol A formaldehyde novolac resin; (B) at least one polycaprolactone polyol reactive diluent; (C) at least one photoacid generator, and (D) at least one solvent to dissolve (A), (B) and (C); wherein said solvent comprises 2-pentanone, 3-pentanone, and 1,3-dioxolane and mixtures thereof.

The epoxidized polyfunctional bisphenol A novolac resin (A) suitable for use in the present invention can be obtained by reacting bisphenol A formaldehyde novolac resin and epichlorohydrin. Resins having a weight average molecular weight ranging from 2000 to about 11000 are preferred and resins with a weight average molecular weight ranging from 3000 to 7000 are particularly preferred. Epicoat® 157 (epoxide equivalent weight of 180 to 250 and a softening point of 80-90° C.) made by Japan Epoxy Resin Co., Ltd., and EPON® SU-8 Resin (an epoxidized polyfunctional bisphenol A formaldehyde novolak resin having an average of about eight epoxy groups and having an average molecular weight of about 3000 to 6000 and having epoxide equivalent weight of 195 to 230 g/eq and a softening point of 80 to 90° C.) made by Resolution Performance Products and the like are cited as preferred examples of the epoxidized polyfunctional bisphenol A novolac resins suitable for use in the present invention. A preferred structure is shown in Formula I wherein R is hydrogen or glycidyl and k is a real number ranging from 0 to about 30.

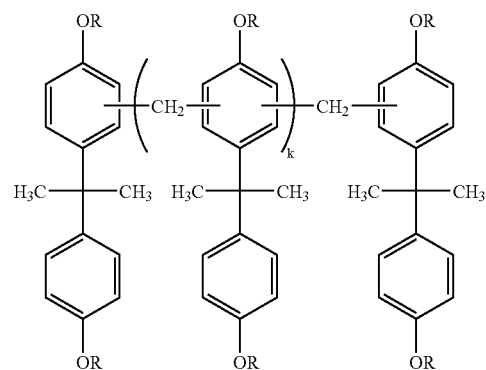

Formula I

The polycaprolactone polyol component (B) contains hydroxy groups capable of reacting with epoxy groups under the influence of a strong acid catalyst and serves as reactive diluent for the epoxy resin. The polycaprolactone polyols soften the dried coatings and thereby prevent the coating from cracking when coated flexible substrates are wound around cylinders to provide rolls of dry film photoresist. This flexibility feature is essential for practical operation of the invention because the laminating machinery commonly used to apply dry film photoresists requires that a roll of dry film resist be mounted on the laminating machine. Examples of polycaprolactone polyols suitable for use in the invention are Tone® 201 and Tone® 305 obtained from Dow Chemical Company. TONE® 201 is a difunctional polycaprolactone polyol with a number average molecular weight of about 530 gram/mole, with the structure shown as Formula 2, where $R_1$ is a proprietary aliphatic hydrocarbon group, and with average n=2. TONE® 305 is a trifunctional polycaprolactone polyol with a number average molecular weight of about 540 gram/mole, with the structure shown as Formula 3, where $R_2$ is a proprietary aliphatic hydrocarbon group and with average x=1.

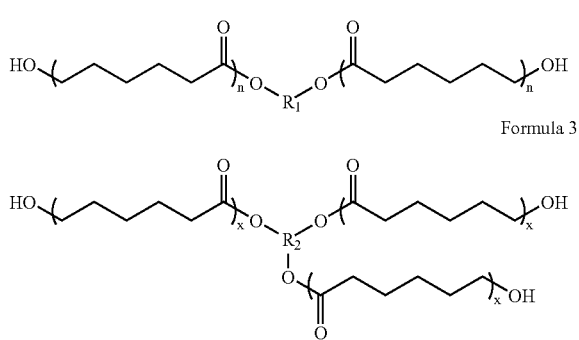

Formula 2

Formula 3

Compounds that generate a protic acid when irradiated by active rays, such as ultraviolet rays, and the like, are preferred as the photoacid generator (C) used in the present invention. Aromatic iodonium complex salts and aromatic sulfonium complex salts are cited as examples. Di-(t-butylphenyl)iodonium triflate, diphenyliodonium tetrakis(pentafluorophenyl) borate, diphenyliodonium hexafluorophosphate, diphenyliodonium hexafluoroantimonate, di(4-nonylphenyl)iodonium hexafluorophosphate, [4-(octyloxy)phenyl]phenyliodonium hexafluoroantimonate, and the like are cited as specific examples of the aromatic iodonium complex salts that can be used. Moreover, triphenylsulfonium triflate, triphenylsulfonium hexafluorophosphate, triphenylsulfonium hexafluoroantimonate, triphenylsulfonium tetrakis(pentafluorophenyl) borate, 4,4'-bis[diphenylsulfonium]diphenylsulfide, bis-hexafluorophosphate, 4,4'-bis[di(β-hydroxyethoxy) phenylsulfonium]diphenylsulfide bis-hexafluoroantimonate, 4,4'-bis[di(β-hydroxyethoxy)(phenylsulfonium)diphenyl sulfide-bishexafluorophosphate7-[di(p-tolyl)sulfonium]-2-isopropylthioxanthone hexafluorophosphate, 7-[di(p-tolyl) sulfonio-2-isopropylthioxanthone hexafluoroantimonate, 7-[di(p-tolyl)sulfonium]-2-isopropyl tetrakis(pentafluorophenyl)borate, phenylcarbonyl-4'-diphenylsulfonium diphenylsulfide hexafluorophosphate, phenylcarbonyl-4'-diphenylsulfonium diphenylsulfide hexafluoroantimonate, 4-tert-butylphenylcarbonyl-4'-diphenylsulfonium diphenylsulfide hexafluorophosphate, 4-tert-butylphenylcarbonyl-4'-diphenylsulfonium diphenylsulfide hexafluoroantimonate, 4-tert-butylphenylcarbonyl-4'-diphenylsulfonium diphenyl-sulfide tetrakis(pentafluorophenyl)borate, diphenyl [4-(phenylthio)phenyl]sulfonium hexafluoroantimonate and the like can be cited as specific examples of the aromatic sulfonium complex salt that can be used. Certain ferrocene compounds, such as Irgacure 261 manufacture by Ciba Specialty Chemicals may also be used. The cationic photoinitiators (C) can be used alone or as mixtures of two or more compounds.

The preferred photoacid generator consists of a mixture of triaryl sulfonium salts with structure shown below as Formula 4, where Ar represents a mixture of aryl groups. Such a material is commercially available from Dow Chemical Company under the trade names CYRACURE® Cationic Photoinitiator UVI-6974 or UVI-6976, which consist of an approximately 50% solution of compound of Formula 4 dissolved in propylene carbonate.

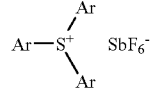

Formula 4

The solvent or solvent mixture (D) of the present invention is capable of dissolving the other components in the composition. This solvent or solvent mixture (D) (1) does not cause coating defects such a bubbles, dewets, and rough coating surfaces when the compositions are coated and dried on a flexible substrate to produce the composite article of dry film resist according to the invention; (2) does not result in coatings that stick to the masks used in photolithography; and (3) does not result in a composite. article wherein the photoimageable coating cracks when the composite article is wound around a cylindrical object such as the roll cores commonly used in the dry film photoresist art.

Suitable solvents (D) are selected ketones and ethers with boiling points ranging from about 60° C. to about 140° C. Solvents selected from this group provide drying characteristics that result in acceptable drying times on web coating equipment but are not so volatile as to create an abundance of bubble defects in a dried film resist. Such ketone solvents are 2-pentanone and 3-pentanone and a suitable ether solvent is 1,3-dioxolane. More preferred is to use mixtures of one of these ketones with 1,3-dioxalane. In the most preferred embodiment, solvent (D) is a mixture of 1,3-dioxolane and 2-pentanone where the weight ratio of 1,3-dioxolane to 2-pentanone is from about 1:9 to 9:1, preferably 1:3 to 3:1 and most preferably 1:2 to 2:1.

In addition to components (A) through (D) inclusively, the compositions may optionally comprise one or more of the following additive materials: (E) one or more epoxy resins; (F) one or more reactive monomers; (G) one or more photosensitizers; (H) one or more adhesion promoters: (J) one or more light absorbing compounds including dyes and pigments; (K) one or more surface leveling agents, and (L) one or more solvents with a boiling point greater than 150° C. Suitable surface leveling agents (K) include fluoroaliphatic esters such as FC 430 or FC 4430 (3M Company), hydroxyl terminated fluorinated polyethers such as PolyFox PF-636 and PF-5620 (Omnova Solutions), fluorinated ethylene glycol polymers such as FluorN-561 and 562 (Cytonix Corporation), acrylic polymer leveling agents such as Modaflow (Surface Specialties, Inc.) and the like. In addition to components (A) through (L) inclusively, the compositions may optionally comprise additional materials including, without limitation, flow control agents, thermoplastic and thermosetting organic polymers and resins, inorganic filler materials, and radical photoinitiators.

Optionally, it may be beneficial in certain embodiments to use an additional epoxy resin (E) in the composition. Depending on its chemical structure, optional epoxy resin (E) may be used to: adjust the lithographic contrast of the photoimageable coating, modify the optical absorbance of the photoresist film, or improve the toughness of the coating. The optional epoxy resin (E) may have an epoxide equivalent weight ranging from 160 to 500 grams resin per equivalent (g/eq.) of epoxide. Examples of optional epoxy resins suitable for use include EOCN 4400, an epoxy cresol-novolac resin with an epoxide equivalent weight of about 195 g/eq. manufactured by Nippon Kayaku Co., Ltd., Tokyo, Japan; cycloaliphatic epoxies as disclosed in U.S. Pat. Nos. 4,565,859 and 4,481,017 where a preferred commercial example is EHPE 3150 epoxy resin which has an epoxide equivalent weight of 170 to 190 g/eq. and is manufactured by Daicel Chemical Industries, Ltd., Osaka, Japan, biphenyl-type epoxy resins such as NC-3000 (epoxide equivalent weight of 270 to 300 g/eq and a softening point of 55 to 75° C.) made by Nippon Kayaku Co., Ltd., and the epoxidized polycondensates of bisphenol F with epichlorohydrin such as NER-7406 made by Nippon-Kayaku Co., Ltd., and the epoxidized polycondensates of bisphenol A with epichlorohydrin such as NER-1302 made by Nippon Kayaku Co., Ltd.), and the like are cited as examples of optional epoxy resins that may used in the present invention. These optional epoxy resins may be used in amounts up to 50% by weight of the total solids of the composition.

The amount of epoxidized polyfunctional bis-phenol A formaldehyde novolac resin (A) that may be used is from about 95% to about 75% of the total weight of components (A) and (B); and more preferably from about 93% to about 78% by weight; and most preferably from about 91% to about 80% by weight of those two components.

The amount of polycaprolactone polyol reactive diluent (B) wherein the amount used is expressed as a percentage of the sum of (A) and (B) is from about 5% to about 25% by weight and it is more preferred to use from about 7% to about 22% by weight and most preferably to use from about 9% to about 20% by weight.

The amount of photoacid generator compound (C) that may be used is from about 0.1% to about 12.5% by weight, based on the total weight of component (A) and (B). It is more preferred to use from about 1% to about 8% by weight of (C) and most preferably, from about 2% to about 7% by weight, based on the total weight of (A) and (B).

The preferred amount of solvent component (D) that may be used is from about 25% to about 75% weight percent of the total composition. It is more preferred to use from about 30% to about 75% by weight percent solvent and most preferred to use from about 35% by weight to about 70% by weight of solvent. The exact amount of solvent that may be used depends to the desired coating thickness. Compositions containing lower amounts of solvent provide higher solids content and are useful for preparing thick coatings while greater amounts of solvent decrease the solids content and such compositions are useful for preparing thin films.

Optionally, it may be beneficial in certain embodiments. to use a reactive monomer compound (F) in the compositions according to the invention. Glycidyl ethers containing two or more glycidyl ether groups are examples of reactive monomer (F) that can be used. Compounds with two or more functional groups are preferred and diethylene glycol diglycidyl ether, propylene glycol diglycidyl ether, polypropylene glycol diglycidyl ether, hexanediol diglycidyl ether, trimethylolpropane triglycidyl ether, pentaerythritol tetraglycidyl ether, and the like are cited as examples. The glycidyl ethers can be used alone or as mixtures of two or more. Aliphatic and aromatic monofunctional and/or polyfunctional oxetane compounds are another group of optional reactive monomers (F) that can be used in the present invention. Specific examples of the aliphatic or aromatic oxetane reactive monomers that can be used include 3-ethyl-3-hydroxymethyloxetane, 3-ethyl-3-phenoxymethyloxetane, xylylene dioxetane, bis(3-ethyl-3-oxetanylmethyl)ether, and the like. These monofunctional and/or polyfunctional oxetane compounds can be used alone or as mixtures of two or more. Alicyclic epoxy compounds can also be used as reactive monomer (F) in this invention and 3,4-epoxycyclohexylmethyl methacrylate and 3,4-epoxycyclohexylmethyl-3',4'-epoxycyclohexane carboxylate may be cited as examples. These optional reactive monomers may be used in amounts up to 30% by weight of the total solids of the composition.

Optionally, it may be useful to include photosensitizer compounds (G) in the composition so that more ultraviolet rays are absorbed and the energy that has been absorbed is transferred to the cationic photopolymerization initiator. Consequently, the process time for exposure is decreased. Anthracene, N-alkyl carbazole, and thioxanthone compounds are examples of photosensitizers that can be used in the invention. Anthracene compounds with alkoxy groups at positions 9 and 10 (9,10-dialkoxyanthracenes) are preferred photosensitizers (I). $C_1$ to $C_4$ alkoxy groups such as methoxy groups, ethoxy groups, and propoxy groups are cited as the preferred alkoxy groups. The 9,10-dialkoxyanthracenes can also have substituent groups. Halogen atoms such as fluorine atoms, chlorine atoms, bromine atoms, and iodine atoms, $C_1$ to $C_4$ alkyl groups such as methyl groups, ethyl groups, and propyl groups, sulfonic acid groups, sulfonate ester groups, carboxylic acid alkyl ester groups, and the like are cited as examples of substituent groups. $C_1$ to $C_4$ alkyls, such as methyl, ethyl, and propyl, are given as examples of the alkyl moiety in the sulfonic acid alkyl ester groups and carboxylic acid alkyl ester groups. The substitution position of these substituent groups is preferably at position 2 of the anthracene ring system. 9,10-Dimethoxyanthracene, 9,10-diethoxyanthracene, 9,10-dipropoxyanthracene, 9,10-dimethoxy-2-ethylanthracene, 9,10-diethoxy-2-ethylanthracene, 9,10-dipropoxy-2-ethylanthracene, 9,10-dimethoxy-2-chloroanthracene, 9,10-dimethoxyanthracene-2-sulfonic acid 9,10-dimethoxyanthracene-2-sulfonic acid methyl ester, 9,10-diethoxyanthracene-2-sulfonic acid methyl ester, 9,10-dimethoxyanthracene 2-carboxylic acid, 9,10-dimethoxyanthracene-2-carboxylic acid methyl ester, and the like can be cited as specific examples of the 9,10-dialkoxyanthracenes that can be used in the present invention. Examples of N-alkyl carbazole compounds useful in the invention include N-ethyl carbazole, N-ethyl-3-formyl-carbazole, 1,4,5,8,9-pentamethyl-carbazole, N-ethyl-3,6-dibenzoyl-9-ethylcarbazole, and 9,9'-diethyl-3,3'-bicarbazole. Examples of thioxanthone compounds useful in the invention are 2-isopropyl-thioxanthone and 1-chloro-2-propoxy-thioxanthone. The sensitizer compounds (G) can be used alone or in mixtures of two or more in amounts up to 10% by weight of the total solids of the composition.

In certain embodiments, it may be useful to add an optional adhesion promoting material to the composition in order to create a stronger bond between the substrate and the dry film resist coating. Examples of optional adhesion promoting compounds (H) that can be used in the invention include: 3-glycidoxypropyltrimethoxysilane, 3-glycidoxypropyltriethoxysilane, vinyl triethyoxysilane, and the like. These compounds may be employed in amounts up to 5% by weight of the total solids of the composition.

Optionally and in certain embodiments, it may be useful to include light absorbing compounds (J) that absorb actinic radiation. Such compounds can be used to better provide a relief image cross section that has a reverse tapered shape such that the imaged material at the top of the image is wider than the imaged material at the bottom of the image. Benzophenone compounds such as 2,4-dihydroxybenzophenone and 2,2',4,4'-tetrahydroxybenzophenone, salicylic acid compounds such as phenyl salicylate and 4-t-butylphenyl salicylate, phenylacrylate compounds such as ethyl-2-cyano-3,3-diphenylacrylate, and 2'-ethylhexyl-2-cyano-3,3-diphenylacrylate, benzotriazole compounds such as 2-(2-hydroxy-5-methylphenyl)-2H-benzotriazole, and 2-(3-t-butyl-2-hydroxy-5-methylphenyl)-5-chloro-2H-benzotriazole, coumarin compounds such as 4-methyl-7-diethylamino-1-benzopyran-2-one, thioxanthone compounds such as diethylthioxanthone, stilbene compounds, naphthalic acid compounds, azo dyes, and the like are cited as specific examples of the light absorbing compounds (J) that can be used in the present invention either singly or as mixtures. These light absorbing compounds may be used in amounts up to 10% by weight of the total solids of the composition. Suitable solvents (L) with a boiling point greater than 150° C. include, but are not limited to, one or more of the group of solvents consisting of ethyl 3-ethoxypropionate, ethyl lactate, N-methyl pyrrolidone, dimethyl acetamide, gamma-butyrolactone, gamma-valerolactone, delta-valerolactone, propylene carbonate, propylene glycol diacetate, dimethyl sulfoxide, methyl sulfone, 1,4-sulfolane, and dialkyl, diaryl, or alkyl-aryl esters of the group of dicarboxylic acids containing 3 to 6 carbon atoms such as diethyl malonate, diethyl succinate and diethyl adipate. If used, these co-solvents may constitute up to 50% by weight of the total weight of solvents employed.

Optionally, still other ingredients could be added besides ingredients (E) to (L). These include epoxy resins, epoxy acrylate and methacrylate resins, and acrylate and methacrylate homopolymers and copolymers can be used in the present invention. Phenol-novolac epoxy resins, trisphenolmethane epoxy resins, and the like are cited as examples of such alternate epoxy resins, and a methacrylate monomer such as pentaerythritol tetra-methacrylate and dipentaerythritol penta- and hexa-methacrylate, a methacrylate oligomer such as epoxymethacrylate, urethanemethacrylate, polyester polymethacrylate, and the like are cited as examples of methacrylate compounds. The amount used may be from about 0.1% to about 50 weight % of the total weight of components (A) and (B).

In addition, optional inorganic fillers such as barium sulfate, barium titanate, silicon oxide, amorphous silica, talc, clay, magnesium carbonate, calcium carbonate, aluminum oxide, aluminum hydroxide, montmorillonite clays, and mica powder can be used in the present invention, and the content of inorganic filler may be 0.1 to 20 weight % of the composition.

When necessary, various other optional materials such as crosslinking agents, thermoplastic resins, coloring agents, thickeners, and agents that impart close adhesion can be further used in the present invention. Crosslinking agents can include, for example, methoxylated melamine, butoxylated melamine, and alkoxylated glycouril compounds. Cymel® 303 from Cytec Industries, West Patterson, N.J., is a specific example of a suitable methoxylated melamine compound. Powderlink® 1174 from Cytec Industries, West Patterson, N.J. is a specific example of an alkoxylated glycouril compound. Polyether sulfone, polystyrene, polycarbonate, and the like are cited as examples of thermoplastic resins; phthalocyanine blue, phthalocyanine green, iodine green, crystal violet, titanium oxide, carbon black, naphthalene black, and the like are cited as examples of coloring agents; asbestos, orben, bentonite, and montomorillonite are cited as examples of thickeners and silicone-containing, fluorine-containing, and polymeric defoaming agents are cited as examples of defoaming agents. When these additives and the like are used, their general content in the composition of the present invention is 0.05 to 3 weight % each, but this can be increased or decreased as needed in accordance with the application objective.

The liquid coating composition of the present invention can be prepared by combining components (A) through (D) and optional components (E) though (L) and when necessary, other optional ingredients such as inorganic fillers and other additives, preferably at the above-mentioned amounts or ratios, mixing uniformly, dissolving, dispersing, and the like with a roll mill, paddle mixer, or similar devices known in the compounding art. It is particularly preferred that components (A) through (K) exclusive of solvent components (D) and optionally (G) are diluted with solvent component D and adjusted to a solution viscosity and solids content appropriate to the intended use of the composition.

The composite article of dry film resist is comprised of at least two layers. The first layer is a flexible film comprised of an organic polymer film and is commonly known in the art as the web or web material. The second layer is a substantially dried coating of the above-noted photo-imagable coating composition. Optionally, other layers may be present such as a thin coating on the web material designed to provide improved wetting characteristics or protective cover films that are placed on the dried photoresist coating.

Web materials that may be used are those films that: provide a surface wettable with the liquid formulation; provide sufficient adhesion with the coating so that the coating sticks to the substrate film; provides low enough adhesion so that the resist coating does not adhere to the web when the composite film is laminated to a substrate and the web is removed; and provides sufficient dimensional stability to the composite article during its manufacture and subsequent use. Examples of web materials suitable for use include, but are not limited too, polyester film such as Mylar® polyesters available from Dupont-Teijin Films and polymide film such as Kapton® polyimides available from Dupont. Polyester film is preferred web material due to its lower cost. It is preferred to use web films with a thickness ranging from about 0.001 inches to about 0.003 inches.

Optionally, a protective cover film may be placed in contact with the photoresist layer. A suitable protective cover film must have low adhesion to the resist coating so that it can be removed from the dry film resist without pulling the resist coating away from the web material. Use of protective cover films is preferred when the dry film resist is wound on rolls for storage and subsequent use. Cover sheet films suitable for use include films made from polyethylene, polypropylene, fluoropolymers, and polyesters with silicones or fluoropolymers. It is preferred to use cover film materials with a thickness ranging from about 0.0005 inches to about 0.002 inches.

The photoimagable coating layer or liquid resist coating may be applied to the web material using a variety of methods and types of machinery. All the methods suitable for use provide a means of controlling the thickness of the coating across both the width and length of the coated film and a means of removing a major amount of the volatile solvent.

Coating methods that may be used to provide a wet coating of liquid resist on the web material include rod coating, curtain coating, roller coating, gravure coating, slot coating, and blade coating. The volatile solvent is removed from the wet web by heat treatment using forced air or convection oven equipment operating at a temperature between 60° C. and 160° C. for a time sufficient to remove the desired amount of solvent. The most preferred arrangement is to use a system of integrated machinery in which the web material is unwound from a stock roll, passed continuously through a linked system comprised of a coating module and a drying module, and then rewound on a roll to provide the dry film resist in roll format that can be stored for subsequent use. The linked system may further comprise a module for applying a protective cover sheet prior to forming the roll of dry film resist and may further comprise measurement equipment used to monitor the thickness of the resist coating and to detect flaws in the surface of the dried photoresist.

In one embodiment the dry film photoresist is used by first peeling the protective cover sheet from the photoresist layer, placing the dry film on a substrate with the photoresist side in contact with the substrate, laminating the photoresist to the substrate by application of heat and pressure using a lamination device and then peeling the base web film from the photoresist. These operations result in forming a photoresist layer on the substrate which may be subsequently processed image-wise using the methods described herein. The dry film photoresists compositions according to the invention may be applied to a substrate in multiple layers by repeating the dry film photoresist lamination process on a substrate a sufficient number of times to form a photoresist layer on the substrate having a thickness appropriate to the needs of the application. For example, four sequential laminations of dry film resist each 20 microns in thickness can be applied to a substrate to form a photoresist coating 80 microns thick that may be further processed image wise to provide a relief structure with features 80 microns thick. In another embodiment, a 20 micron thick layer of dry film resist may be applied followed by a layer 14 microns thick to provide a 34 micron thick layer of photoresist that can be further processed image wise to provide a relief structure with features 34 microns thick. Thus, the sequential laminations are additive with respect to thickness. This method provides significant flexibility to end use manufacturing operations because a large number of coating thickness can be formed on substrates using a small number of individual dry film photoresists of different thickness. Thick dry film resists compositions according to the invention can be formed during the process of manufacture of the dry film photoresist. In this embodiment, a thick dry film resist is formed by laminating together multiple pieces of dry film resist to provide a composite article of dry film resist comprising a first layer of web film material, a second layer of photoresist, and a third layer of web film material. To further exemplify this embodiment, the process may consist of the following steps: (1) removing, if present, the protective cover film from each of two lengths of dry film photoresist wherein the thickness of the photoresist layers may be the same or different, (2) contacting together the surfaces of the dry film photoresist that are coated with photoresist to provide a film stack; (3) laminating the film stack under the action of heat and pressure to produce a composite article of dry film photoresist wherein the thickness of the layer of photoresist composition is approximately the sum of the thicknesses of the dry film photoresists used to make the laminate. The process may be used to provide an even thicker layer of photoresist composition by removing either the first or the third layers of web film and then repeating steps 2 and 3. This process may be repeated a sufficient number of times to provide an article of dry film photoresist wherein the final thickness of the photoresist layer is determined by the thickness and number of photoresist layers that are laminated together. The dry film photoresists of this embodiment are used by first peeling one of either of the layers of web film material from the photoresist layer, placing the dry film on a substrate with the photoresist side in contact with the substrate, laminating the photoresist to the substrate by application of heat and pressure using a lamination device and then peeling the base web film from the photoresist. These operations result in forming a photoresist layer on the substrate which may be subsequently processed image-wise using the methods described herein.

The solid photoresist coating can be photoimaged using an exposure tool with near-ultraviolet radiation from a medium- or high-pressure mercury lamp through a photomask containing a pattern of opaque and transparent regions. Contact, proximity, or projection printing may be used. Alternatively, the coating may be exposed with either electron beam radiation or other types of actinic radiation such as x-ray. Following exposure, a post-exposure-bake is carried out in order to accelerate the acid catalyzed polymerization reaction in the exposed regions of the coating; typical bakes are carried out on a hotplate for 1 minute at 65° C. and 5 minutes at 95° C. The coating is then immersed in an organic solvent developer in order to dissolve away the non-polymerized regions, typically for 2-5 minutes depending on the thickness of the coating and the solvent strength of the developer solvent. The developed negative image is preferably rinsed by application of a rinse solvent to remove residual developer. Removal of the residual developer may be necessary because the residual developer may contain dissolved photoresist components that will form deposits in the negative relief image if the residual developer is allowed to dry on the substrate. Optionally, a post-bake may be performed after development on the resulting image to more fully harden the material by driving the polymerization reaction to a higher degree of conversion.

Optionally, the developer solvent may be applied by spraying using either an atomizing spray nozzle or fine showerhead type spray nozzle. Yet another method of developing the image comprises applying the developer using what is known in the photoresist art as a puddle process wherein the substrate to be developed is placed on a rotating tool head and then an amount of developer sufficient to form a standing layer or puddle on the entire substrate area is dispensed onto the substrate and allowed to stand for a defined period of time. After this time, the substrate is rotationally accelerated to spin off the spent developer and then decelerated until rotation stops. This sequence is repeated until a clear relief image is obtained and it is common to use a process wherein two to four solvent puddles are formed.

Suitable developer solvents include, but are not limited to, propylene glycol methyl ether acetate, gamma-butyrolactone, acetone, cyclopentanone, diacetone alcohol, tetrahydrofurfuryl alcohol, N-methyl pyrrolidone, and ethyl lactate. The developer solvents can be used singly or as mixtures. Propylene glycol methyl ether acetate is particularly preferred because of its good solvency for the unexposed photoresist components and relatively low cost.

Suitable rinse solvents include any of the developer solvents mentioned above as well as methanol, ethanol, isopropanol, and n-butyl acetate. It is preferred that the rinse solvents dry quickly and in this regard acetone, methanol, ethanol, and isopropanol are particularly preferred.

The liquid coating compositions according to the invention, while intended for use in the manufacture of dry film photoresists, may be used as conventional liquid photoresists.

When used as a conventional liquid photoresist, the photoresist compositions of the present invention may be applied to a substrate by spin-coating, consisting of dispensing the liquid photoresist onto a substrate, accelerating the substrate to a constant rotational speed, and holding the rotation speed constant to achieve the desired coating thickness. Spin-coating may be performed with variable rotational velocity in order to control the thickness of the final coating. Alternatively, the photoresist composition may be applied to the substrate using other coating methods such as dip or spray coating. After spin-coating, a drying bake is performed to evaporate the solvent. The drying bake conditions are chosen so as to form a tack free film of photoresist and typical conditions are 1 minute at 65° C. followed by 5-10 minutes at 95° C. on a hotplate wherein the substrate is in contact or near contact with the surface of the hotplate. Alternatively, the drying bake may be performed in a convection oven. The photoresist is then exposed and developed as described above.

A variety of conventional substrate materials may be processed using dry film or liquid resist compositions of the present invention. Suitable substrates include, but are not limited to, silicon, silicon dioxide, silicon nitride, alumina, glass, glass-ceramics, gallium arsenide, indium phosphide, copper, aluminum, nickel, iron, steel, copper-silicon alloys, indium-tin oxide coated glass, organic films such as polyimide and polyester, as well as dry film layers previously imaged including dry film layers of the present invention. Any substrate bearing patterned areas of metal, semiconductor, and insulating materials, and the like. No special pre-treatment of the substrate is necessary for operation of the invention. Optionally, a bake step may be performed on the substrate to remove absorbed moisture prior to applying the photoresist coating.

The photoresist compositions according to the invention have excellent imaging characteristics and the cured products have excellent chemical resistance to solvents, alkali, and acids and show good thermal stability and electrical properties.

The laminated, imaged and optionally cured product of the compositions according to the invention may be used in most of the applications where liquid photoimageable compositions containing SU-8 resin have been used. The only limitations on use of the dry film resists of the present invention as a replacements for liquid resists containing SU-8 is that the article of manufacture must comprise a substrate that can be subjected to the lamination conditions of heat and pressure necessary to affix the dry film photoresist to the substrate in a manner suitable to the intended use and that the properties of the resulting structure meet the needs of the intended use. These coated substrates can be subjected to conventional processes (e.g. etching, plating and the like) to treat the exposed surfaces on the substrate.

For example, the laminated, imaged, and optionally cured products of the compositions according to the invention may be used in place of SU-8 resin containing liquid resists to form a reactive ion etch masks used in the fabrication of high density, area array printing plates for printing biological inks as disclosed in U.S. Patent Application No. 2003/0059344 or in the fabrication of cell transfection plates and transfection apparatus as disclosed in U.S. Pat. Nos. 6,652,878 and 6,670,129. As an additional example from field of biological applications, the compositions according to the invention may be used to fabricate a plurality of microfluidic channels in devices for parallel, in-vitro screening of biomolecular activity as taught in U.S. Pat. Nos. 6,576,478 and 6,682,942.

In the field of MEMS, the laminated, imaged, and optionally cured products of the compositions according to the invention may be used in place of SU-8 resin containing liquid resists for the fabrication of: micro-power switching devices as taught in U.S. Pat. No. 6,506,989; insulating layers in microrelay devices as taught in U.S. Pat. No. 6,624,730; drug delivery devices and sensors as taught in U.S. Pat. No. 6,663,615; multilayer relief structures as described in U.S. Pat. No. 6,582,890; and electromagnetic actuators as described in U.S. Pat. No. 6,674,350. Further and in the area of sensors, the compositions may be used, for example, in the fabrication of ultraminature fiber optic pressure transducers as taught in U.S. Pat. No. 6,506,313 and the fabrication of cantilever tips for application in atomic force microscopy (AFM) as taught in U.S. Pat. No. 6,219,140.

The laminated, image, and optionally cured product of the compositions according to the invention may be used in place of SU-8 resin containing liquid resists in electronic packaging applications related to forming protective coatings on semiconductor wafers and singulated devices as taught in U.S. Pat. No. 6,544,902.

Several U.S. patents teach the use of dry film resists to making electrical printed circuit boards, offset printing plates and other copper-clad laminates. These include: U.S. Pat. Nos. 3,469,982; 4,193,799; 4,576,902; 4,624,912 and 5,043,221. U.S. Pat. No. 3,708,296 teaches the use of dry film photoresist in making acid and alkali resist images for chemical milling, screenless lithography, printing plates, stencil making, microimages for printed circuitry, thermoset vesicular images, microimages for information storage, decoration of paper, glass and metal packages and light cured coatings. The laminated, imaged and cured products of the present invention may be used in place of the dry film resists disclosed in these references.

There have been numerous disclosures on the utility of liquid SU-8 resin containing photoresists in the fabrication of the print head component of ink jet printer cartridges wherein the laminated, imaged, and optionally cured products of the compositions according to this invention may be used in place of SU-8 resin containing liquid resists. A by no means inclusive, but illustrative group of examples showing applications in the area of ink jet print heads include the teachings of U.S. Pat. Nos. 5,859,655, 6,193,359, 5,969,736, 6,062,681, 6,419,346, 6,447,102, 6,305,790, and 6,375,313

The present invention is further described in detail by means of the following Examples and Comparisons. All parts and percentages are by weight and all temperatures are degrees Celsius unless explicitly stated otherwise.

EXAMPLES

Coating Solvents Experiments

Example 1

Effect of Solvent on Dry Film Photoresist Coating Defects

A solvent system suitable for use in the invention must: dissolve all components of a coating composition; provide a uniform wet coating; not result in the formation of an excessive amount of bubbles or other coating defects when the composition is dried on a coating web; allow formulation of the composition to a solid content and viscosity appropriate to the requirements of the coating method to be used; provide coatings that are sufficiently tack-free to allow roll winding and unwinding; and provide drying characteristics that are compatible with the physical limits of the coating equipment with respect to allowable coating application rates, belt speeds, and oven temperatures.

Although cyclopentanone has been shown (U.S. Pat. No. 6,391,523) to perform well as a solvent for photoresist compositions designed for spin coating applications, its use as a solvent in dry film coating applications leads to the formation of an excessive amount of bubble defects in dry film resist coatings as described in Comparative Example 2.

Accordingly, a series of trial photoresist compositions was prepared to find a solvent composition that provides these requirements. Table 1 provides a list of formulation component information including name, function, supplier, an abbreviation that is used to designate the component in composition formularies, and in the case of solvents, boiling points. All photoresist compositions were prepared by individually weighing the components of the compositions into 20 milliliter glass scintillation vials. The vials were tightly capped with screw caps and then mixed by rolling on a US Stoneware Model 755RMV jar mill under an infrared heat lamp at 40-60° C. for 4-8 hr until all components were completely dissolved. The samples were allowed to cool to room temperature and were evaluated without further manipulation. Table 2 provides the formularies of the photoresist compositions of this Example.

The coating compositions were evaluated by preparing draw down coatings on Kapton® film using a wire rod coating bar. Accordingly, a piece of Kapton polyimide film (Dupont Company) with a nominal 2.0 mil thickness was cut from a roll of film using scissors and trimmed to provide a flexible film substrate approximately 10 inches in length and 5 inches in width. The Kapton film was mounted under the spring clip of an ACCU-LAB™ Auto-Draw III (Industry Tech, Oldsmar, Fla.) coating machine equipped with a #20 ACCU-LAB™ Jr. (Industry Tech) wire-wound Mayer coating rod. The film was cleaned with acetone and allowed to air dry. A 2 to 3 gram aliquot of the dry film photoresist compositions of Table 2 was dispensed as a bead along the length and just ahead of the coating rod using a disposable polypropylene dropper. The coating machine was started and the rod was driven by a motor down the length of the film to provide a wet coating of dry film resist composition on the Kapton film. The coated film was removed from the coating machine by releasing the spring clip. The coated film was placed on a clean baking sheet and dried at 100° C. for 15 minutes in a Freas Hi Performance Safety Oven Model 6255. The coatings were inspected for the presence or absence of coating defects and the results of the inspection are described in Table 2.

The results show that bubble free coatings are obtained when 2-pentanone, mixtures of 2-pentanone and cyclopentanone, mixtures of 2-pentanone and 1,3-dioxolane, and mixtures of cyclopentanone and 2-heptanone are used as coating solvent D. Of these combinations, it is preferred to use solvents with lower boiling points so that wet films dry quickly. Therefore, 2-pentanone and mixtures of 2-pentanone with 1,3-dioxolane are preferred combinations. Because compositions containing solvent mixtures wherein each solvent has a boiling point below 120° C. and wherein one solvent has a low boiling point and the other solvent has a higher boiling point are expected to dry quickly, the compositions containing mixtures of 2-pentanone and 1,3-dioxolane are particularly preferred.

TABLE 1

Table of component data.

| Material Name | Function | Supplier | Abbreviation | Boiling Point ° C. |
|---|---|---|---|---|
| SU-8 Epoxy Resin | Resin A | Resolution Performance Products | SU-8 | Not Applicable |
| Tone 0305 Polyol | Diluent B | Dow Chemical Company | Tone 305 | Not Applicable |
| Cyracure 6974 | PAG C | Dow Chemical Company | 6974 | Not Applicable |
| Cyclopentanone | Solvent D | Rhodia | CP | 130-131 |
| 2-Pentanone | Solvent D | Aldrich Chemical Company | 2-PT | 105 |
| 1,3-Dioxolane | Solvent D | Ferro Corporation | 1,3-D | 74-75 |
| Isopropyl Ether | Solvent D | Aldrich Chemical Company | IPE | 68-69 |
| Nitroethane | Solvent D | Aldrich Chemical Company | NE | 114-115 |
| 2-Heptanone | Solvent D | Aldrich Chemical Company | 2-HP | 149-150 |
| 2-Octanone | Solvent D | Aldrich Chemical Company | 2-OC | 173 |
| n-Butyl Ether | Solvent D | Aldrich Chemical Company | BE | 142-143 |

TABLE 2

Formularies of the dry film photoresist coating compositions of Example 1.

| Formulation | SU-8 Resin | Cyracure 6974 | Solvent 1 | Solvent 2 | Solvent 3 | Observations on coating defects |
|---|---|---|---|---|---|---|
| 1 | 16.55 g 63.65% | 1.65 g 6.35% | 2-PT 7.80 g 30.0% | None | None | Bubble free coating |
| 2 | 16.55 g 63.65% | 1.65 g 6.35% | 2-PT 1.95 g 7.50% | CP 5.85 g 22.5% | None | Bubble free coating |
| 3 | 16.55 g 63.65% | 1.65 g 6.35% | 2-PT 3.90 g 15.0% | CP 3.90 g 15.0% | None | Bubble free coating |
| 4 | 16.55 g 63.65% | 1.65 g 6.35% | 2-PT 3.90 g 15.0% | 1,3-D 3.90 g 15.0% | None | Bubble free coating |
| 5 | 16.55 g 63.65% | 1.65 g 6.35% | IPE 7.80 g 30.0% | None | None | Formulation components not soluble |
| 6 | 16.55 g 63.65% | 1.65 g 6.35% | 2-PT 2.60 g 10.0% | 1,3-D 2.60 g 10.0% | IPE 2.60 g 10.0% | Extensive bubbles in coating |
| 7 | 16.55 g 63.65% | 1.65 g 6.35% | NE 7.80 g 30.0% | None | None | Extensive bubbles in coating |
| 8 | 16.55 g 63.65% | 1.65 g 6.35% | NE 1.95 g 7.50% | CP 5.85 g 22.50% | None | Extensive bubbles in coating |
| 9 | 16.55 g 63.65% | 1.65 g 6.35% | NE 5.85 g 22.50% | CP 1.95 g 7.50% | None | Extensive bubbles in coating |
| 10 | 16.55 g 63.65% | 1.65 g 6.35% | 2-PT 7.02 g 27.00% | NE 0.78 g 3.00% | None | Extensive bubbles in coatings |
| 11 | 16.55 g 63.65% | 1.65 g 6.35% | BE 7.80 g 30.00% | None | None | Components not soluble |
| 12 | 16.55 g 63.65% | 1.65 g 6.35% | 2-HP 0.78 3.00% | CP 7.02 27.00% | None | Bubble free coating |
| 13 | 16.55 g 63.65% | 1.65 g 6.35% | 2-OC 0.78 | CP 7.02 | None | Coating had dewetted |

TABLE 2-continued

Formularies of the dry film photoresist coating compositions of Example 1.

| Formulation | SU-8 Resin | Cyracure 6974 | Solvent 1 | Solvent 2 | Solvent 3 | Observations on coating defects |
|---|---|---|---|---|---|---|
| | | | | 3.00% | 27.00% | areas and an uneven surface finish |

Example 2

Effect of Coating Solvent Composition on Viscosity of SU-8 Resin Solutions

Coating solvents that provide good solvency for formulation components but do not result in high coating viscosity at solids contents useful in dry film coating processes are particularly desirable. To obtain information on the use of cosolvents to modify the viscosity on SU-8 resin containing formulations, a series of compositions was prepared by adding 0.5 gram of cyclopentanone, 1.0 gram of cosolvent, and 25.0 grams of a 74% by weight solution of SU-8 resin in cyclopentanone solvent to a 20 mL glass scintillation vial. The vials were sealed with screw caps and the contents mixed on the US Stoneware jar mill for 4-8 hours while heated using an infrared lamp. The resulting compositions contained 69.8% by weight SU-8 resin, 26.4% by weight cyclopentanone, and 3.8% by weight of cosolvent. The viscosity of each composition was measured at 23.0° C. using a Visco Easy Viscometer at 12 rpm using an L3 spindle and the results are summarized in Table 3. The results in Table 3 show that the preferred cosolvents 1,3-dioxolane or 2-pentanone effectively decrease the viscosity of the resin solutions relative to pure cyclopentanone.

TABLE 3

Effect of cosolvent on the viscosity of SU-8 resin solutions of Example 2.

| Formulation | Name of Cosolvent | Viscosity cPs |
|---|---|---|
| 1 | Cyclopentanone | 11000 |
| 2 | 1,3-Dioxolane | 7200 |
| 3 | 2-Pentanone | 5900 |

Example 3

Effect of Mixtures of 2-pentanone and 1,3-dioxolane on the Viscosity of Dry Film Photoresist Compositions The viscosity of the dry film photoresist coating composition depends on the ratio of 2-pentanone to 1,3-dioxolane. To investigate this dependency, a series of photoresist compositions were prepared wherein the composition of the solvent mixture was varied from 0 to 100 weight percent of total solvent and wherein total solids, defined as the sum of SU-8 resin, Tone 0305 polyol, and Cyracure 6974 solids, was varied from 53% by weight to 57% by weight. In all compositions, the content of Tone 0305 polyol was 11.8% relative to the content of SU-8 resin and the content of Cyracure 6974 solids was 4.6% of the sum of the amounts of SU-8 and Tone 0305. The photoresist compositions were prepared by weighing the calculated amounts of SU-8 resin, Tone 0305 polyol, Cyracure 6974, 2-pentanone, and 1,3-dioxolane into 250 milliliter amber Boston round bottles. The bottles were sealed with screw caps and the contents were mixed on the jar mill with heating using an infrared lamp. The photoresist compositions were mixed for 5 hours at 55° C. The viscosity of each formulation was measured at 25.0° C. in a constant temperature bath using calibrated size 200 Canon-Fenske viscometer tubes. A dry film photoresist sample was prepared from each sample using the wire rod draw down procedure described in Example 1. The dry film coating performance of the compositions was rated as passing (P) if the composition provided a coating free of defects. The coating performance was rated as failing (F) if defects were present in the coating. The formularies, viscosities, and dry film coating performance of each sample are summarized in Table 4.

The data shown in Table 4 demonstrate that the viscosity of the photoresist composition may be controlled by means of the relative amount of each cosolvent. The compositions containing 50% of each solvent based on total solvent are preferred because small changes in the content of either solvent will not cause a significant change in viscosity or coating performance. Furthermore, the data of Table 4 show that compositions containing only 1,3-dioxolane as the solvent do not provide defect free films. In this case, the failure mode was an uneven surface appearance rather than bubbles.

TABLE 4

Effect of solvent composition on photoresist coating composition and dry film resist coating quality.

| Cosolvent Composition Percent of Solvent | | Viscosity (cSt) | | | | | |
|---|---|---|---|---|---|---|---|
| % 2-PT | % 1,3-D | 53% Solids | Coating Quality | 55% Solids | Coating Quality | 57% Solids | Coating Quality |
| 100 | 0 | 26.31 | P | 32.25 | P | 40.65 | P |
| 75 | 25 | 28.12 | P | 37.34 | P | 45.65 | P |
| 50 | 50 | 31.05 | P | 42.43 | P | 50.04 | P |
| 25 | 75 | 36.39 | P | 49.81 | P | 64.43 | P |
| 0 | 100 | 42.72 | F | 59.70 | F | 80.50 | F |

Methods for Formulating Dry Film Photoresist Coating Compositions

Example 4

Formulation of Dry Film Coating Composition Using the Roller Mill Method

A dry film photoresist coating composition was made by combining the components as shown in Table 5.

TABLE 5

Formulary of the dry film photoresist coating composition of Example 4.

| Material | Type | Supplier | Weight grams | Weight % Of Total |
|---|---|---|---|---|
| SU-8 Resin | Resin A | Resolution Performance Products | 1176.5 | 52.79 |
| 2-Pentanone | Solvent D | Aldrich Chemical Company | 396.0 | 17.77 |
| 1,3- | Solvent D | Aldrich Chemical | 396.0 | 17.77 |

TABLE 5-continued

Formulary of the dry film photoresist coating composition of Example 4.

| Material | Type | Supplier | Weight grams | Weight % Of Total |
|---|---|---|---|---|
| Dioxolane | | | | |
| Tone 0305 | Flexibilizer B | Dow Chemical Company | 138.0 | 6.19 |
| Cyracure 6974* | PAG C | Dow Chemical Company | 122.0 | 5.47 |
| Total | | | 2228.5 | 99.99 |

*The Cyracure 6974 used was a lot having 48.13 weight % of aryl sulphonium hexafluoroantimonate salts in propylene carbonate solvent.

The components were weighed into a tared 4 liter amber glass round bottle. The bottle was sealed with a screw cap and the contents were mixed by rolling the bottle on a US Stoneware Model 755RMV jar mill at ambient temperature for 12 hours. The resulting solution was transferred to a pressure vessel and the filled pressure vessel was connected to a Pall Corporation Sol-Vent 0.20 micron PTFE membrane filter cartridge. The pressure vessel was pressurized to 15 psi with dry nitrogen and the contents were filtered through the filter cartridge into 1.0 liter amber Boston Round bottles. The solution had a kinematic viscosity of 129.3 centistokes measured at 25.0° C. with a size 300 Canon-Fenske viscometer tube. The calculated total solids content of the composition was 61.72% by weight where total solids is the sum of SU-8 resin, Tone 0305, and the Cyracure 6974 PAG solids. The content of Cyracure 6974 PAG solids is 4.99 weight % of the amount of SU-8 resin and 4.46 weight % of the sum of the amounts of SU-8 resin and Tone 0305. The content of Tone 0305 is 11.73% of the amount of SU-8 resin.

Example 5

Formulation of a Dry Film Photoresist Coating Composition Using a Mechanical Mixer A dry film photoresist composition was made by combining the components as shown in Table 6.

TABLE 6

Formulary of the dry film coating composition of Example 5.

| Material | Type | Supplier | Weight Kg | Weight % Of Total |
|---|---|---|---|---|
| SU-8 Resin | Resin A | Resolution Performance Products | 111.25 | 46.70 |
| 2-Pentanone | Solvent D | Aldrich Chemical Company | 51.10 | 21.45 |
| 1,3-Dioxolane | Solvent D | Ferro Corporation | 51.10 | 21.45 |
| Tone 0305 | Flexibilizer B | Dow Chemical Company | 13.10 | 5.50 |
| Cyracure 6974* | PAG C | Dow Chemical Company | 11.65 | 4.90 |
| Total | | | 238.2 | 100 |

*The Cyracure 6974 used was a lot having 48.13 weight % of aryl sulphonium hexafluoroantimonate salts in propylene carbonate solvent.

A 350 liter jacketed mixing vessel constructed of 316L stainless steel and equipped with a direct drive stirrer bearing two 3-blade propeller-type agitators was used to prepare the composition. To the mixer was charged 46.54 kilograms of 2-pentanone solvent and 46.54 kg of 1,3-dioxolane solvent. The solvents were mixed by running the agitator for 30 minutes at 80 rpm. Cyracure 6974, 11.65 kilograms, was added and the resulting solution was mixed for 30 minutes at 80 rpm. Tone 0305, 13.10 kilograms, was added and the resulting mixture was stirred for 30 minutes at 80 rpm to yield a clear solution. To the stirred solution of solvents and Cyracure 6974 was then added approximately one half of the required amount of SU-8 resin and stirring was continued at 160 rpm for 30 minutes. After this time, the balance of the SU-8 resin was added and stirring was continued for 240 minutes. The kinematic viscosity of the formulation was measured at 25.4° C. using a size 300 Canon-Fenske viscometer tube and was 55.63 centistokes. Because this viscosity was higher than desired, the viscosity of the formulation was adjusted by adding 4.56 kilograms of 2-pentanone and 4.56 kilograms of 1,3-dioxolane. After mixing for 120 minutes, the viscosity was measured using a size 300 Canon-Fenske viscometer and was 41.19 centistokes. The formulated composition was filtered through a PALL Corporation Emflon 0.20 micron PTFE membrane 10 inch filter cartridge at 10-15 psi into 4 liter amber round glass bottles. The filled bottles were sealed with screw caps. This composition had a calculated total solids content of 54.56 weight % where total solids is the sum of the amounts of SU-8 resin, Tone 0305 polyol, and Cyracure 6974 solids. The content of Cyracure 6974 PAG solids was 5.04 weight % of the amount of SU-8 resin and 4.51 weight % of the sum of the amounts of SU-8 resin and Tone 0305. The content of Tone 0305 was 11.77 weight % of the amount of SU-8 resin.

Preparation of Dry Film Photoresists

Example 6

Preparation of Dry Film Photoresist Using the Draw Down Method with a Wire Rod Coater A piece of Kapton® HN polyimide film (Dupont Company) with a nominal 2.0 mil thickness was cut from a roll of Kapton film using scissors and trimmed to provide a flexible film substrate approximately 10 inches in length and 5 inches in width. The Kapton film was mounted under the spring clip of an ACCU-LAB™ Auto-Draw III (Industry Tech, Oldsmar, Fla.) coating machine equipped with a #20 ACCU-LAB™ Jr. (Industry Tech) wire-wound Mayer coating rod. The film was cleaned with acetone and allowed to air dry. An aliquot of the dry film photoresist composition of Example 5 of about 2 to 3 grams was dispensed as a bead along the length and just ahead of the coating rod using a disposable polypropylene dropper. The coating machine was started and the rod was driven by a motor down the length of the film to provide a wet coating of dry film resist composition on the Kapton film. The coated film was removed from the coating machine by releasing the spring clip. The coated film was placed on a clean metal baking sheet and then dried at 100° C. for 15 minutes in a Freas Hi Performance Safety Oven Model 6255. The thickness of the resulting coating was determined by measuring the combined thickness of the coated film with a micrometer and then subtracting the thickness of the Kapton substrate. The dry film photoresist coating of this example had a thickness of 16 microns, was readily wrapped around a 3 inch core without cracking and delamination, and was essentially free of bubble defects.

Example 7

Preparation of Dry Film Photoresist Using a Commercial Slot Coating Machine

A dry film photoresist coating composition was prepared according to the formulary shown in Table 7. The viscosity of the composition was measured at 25° C. using a size 300 Canon-Fenske viscometer tube and was 48.65 centistokes. The specific gravity of the composition was measured using the pycnometer method and was 1.138 g/mL. The calculated dynamic viscosity was 55.3 centipoise. The composition had a calculated total solid content of 56.21% by weight where total solids is the sum of the amounts of SU-8 resin, Tone 0305 polyol, and Cyracure 6974 solids. The content of Cyracure 6974 PAG solids was 4.97 weight % of the amount of SU-8 resin and 4.45% of the sum of the amounts of SU-8 resin and Tone 0305 polyol. The content of Tone 0305 was 11.69% of the weight of SU-8 resin

TABLE 7

Formulary of the dry film photoresist composition of Example 7.

| Material | Type | Supplier | Weight grams | Weight % Of Total |
|---|---|---|---|---|
| SU-8 Resin | Resin A | Resolution Performance Products | 8915 | 48.2 |
| 2-Pentanone | Solvent D | Aldrich Chemical Company | 3810 | 20.6 |
| 1,3-Dioxolane | Solvent D | Ferro Corporation | 3814 | 20.6 |
| Tone 0305 | Flexibilizer B | Dow Chemical Company | 922 | 5.0 |
| Cyracure 6974* | PAG C | Dow Chemical Company | 1042 | 5.6 |
| Totals | | | 18503 | 100 |

*The Cyracure 6974 used was a lot having 48.13 weight % of aryl sulphonium hexafluoroantimonate salts in propylene carbonate solvent.

The composition of Table 7 was coated on a commercial slot coating machine using a proprietary coating head. The machine used consisted of a slot coating module, two serially arranged web drying ovens designated as Oven Zone 1 and Oven Zone 2, a nip roller module for applying a protective polyethylene cover sheet, and a winding module to wind the coated dry film resist on 3 inch diameter cores. The composition was coated separately on 12 inch wide webs of either Mylar® A Grade 142 gauge film or 2.0 mil thick Kapton® HN film web materials. The coating line speed was held constant during all coating runs. The temperature of Oven Zone 1 was set at 135° F. for coating thicknesses in the range of about 8 to about 15 microns and at 165° F. for coating thicknesses of about 20 microns. The temperature of Oven Zone 2 was set at 195° F. for all coating thicknesses. A polyethylene film protective layer 0.9 mil thick was applied using the nip roller module. The thickness of the coating on the web was adjusted by varying the pumping rate of the coating composition through the slot coating head. In this manner, dry film photoresist having a range of coating thicknesses was produced. The resulting composite articles of dry film photoresist were characterized according to their coating weight in lbs coating per ream (1 ream=3000 square feet), coating thickness, and weight percent retained solvent and these results are summarized below in Table 8.

TABLE 8

Properties of dry film photoresists prepared using a slot coating machine.

| Dry Film Resist Number | Web Material | Coating Weight Lbs/Ream | Coating Thickness Microns | Weight % Retained Solvent |
|---|---|---|---|---|
| 1 | 2.0 mil Kapton HN | 7.0 | 9.4 | 0.6 |
| 2 | Mylar ® A Grade 142 gauge | 11.9 | 14.8 | 1.2 |
| 3 | 2.0 mil Kapton HN | 11.0 | 14.1 | 1.6 |
| 4 | 2.0 mil Kapton HN | 15.5 | 20.4 | 1.4 |

Lamination and Lithographic Processing of Dry Film Photoresist

Example 8

Lamination of Dry Film Photoresist to Silicon Wafer Substrates

An approximately 4 inch by 4 inch square of dry film photoresist was cut from a roll of dry film photoresist Number 3 of Example 7 using scissors. The protective polyethylene cover sheet was removed and the dry film photoresist was placed coated side down on the surface of a 100 mm diameter silicon wafer substrate. The dry film photoresist was then lightly bonded to the wafer by contacting the Kapton surface with the edge of a plastic card held at an angle of about 45°. Starting at the major wafer flat, the card was slid across the diameter of the wafer using gentle hand pressure so that no trapped air bubbles were formed where the photoresist coating contacted the substrate. Next, the card was pushed from the wafer center out to the edge of the wafer while rotating the wafer through a complete 360° revolution. Excess dry film resist that extended beyond the edge of the wafer substrate was trimmed away by contacting a razor blade to the edge of the wafer while rotating the wafer. The wafer was then placed between two sheets of uncoated Mylar film to form a lamination assembly. A Dupont Riston® laminating machine was set to the following operating parameters: air pressure 55 psi, top and bottom roller temperature 85° C., and roller speed 0.3 meters per minute. The lamination assembly was passed through the lamination machine without applied roller pressure to preheat the wafer and help ensure good adhesion of the dry film photoresist to the silicon wafer substrate. The preheated wafer was immediately passed through the lamination machine using 55 psi of air pressure applied to the roller assembly to effect final lamination. The laminated assembly was allowed to cool in the ambient air for 2 minutes. After this time, the top and bottom Mylar sheets were removed and the dry film Kapton web layer was peeled from the substrate leaving a coating of photoresist on the substrate. The lamination process was repeated using 26 silicon wafer substrates. The thickness of the laminated photoresist layer was measured at nine points on each wafer using a SCI Filmtek thickness measurement system. The average photoresist film thickness taken across all thickness measurements was 15.5+0.9/−0.3 microns.

Example 9

Lithographic Imaging of Laminated Dry Film Photoresist

A 100 mm silicon wafer with a laminated coating of photoresist from Example 8 was exposed image-wise in vacuum contact using a variable density photolithography mask designed by MicroChem Corp on an AB-M Inc. Exposure System. The exposure dose ranged from 60 mJ/cm$^2$ to 240 mJ/cm$^2$ and was measured at 365 nm using an AB-M Inc. Intensity Meter. The exposed wafer was baked on a Brewer Science CEE hot plate at 65° C. for 1 minute and then baked on a CEE hot plate at 95° C. for 3 minutes. Following the 95° C. bake, the imaged wafer was cooled for a minimum time of 2 minutes. The image was developed using a spin develop process consisting of the steps of: dispensing propylene glycol monomethyl ether acetate (PGMEA) onto the wafer while spinning the wafer for 10 seconds at a rotational speed of 500 rpm. Rotation was then stopped for 30 seconds leaving a standing puddle of PGMEA developer on the wafer. This cycle of dispense and stop was repeated three more times. After the fourth standing puddle cycle, the wafer was spun at 2000 rpm for 20 seconds. During the first 3 seconds of this cycle, isopropyl alcohol was dispensed on the wafer to rinse off the developer and the final 17 seconds of the cycle was used to spin dry the wafer. This process resulted in a negative relief image of the mask on the wafer with resolution of 15 micron features.

Example 10

Preparation of a Multilayer Dry Film Photoresist Using a Multiple Lamination Process Five 6 inch by 6 inch squares of Dry Film Photoresist 4 of Example 7 were cut from the roll and are designated for the purpose of this example as DF1, DF2, DF3, DF4, and DF5. The polyethylene protective cover film was removed as needed from DF1 through DF5 thereby exposing the layer of photoresist. DF1 and DF2 were then stacked together such that the photoresist layers were contacted together to produce an assembly of stacked films designated as SDF 1. Assembly SDF1 was exposed to the action of heat and pressure by passing the structure through a Riston Laminating Machine using a pressure of 55 psi, a contact roller temperature of 85° C., and a roll speed of 0.3 meters/minute to form a laminated composite article designated as LDF1 consisting sequentially of a layer of Kapton 0.002 inch in thickness, a layer of dry film photoresist about 40 μm in thickness and a second layer of Kapton 0.002 inches in thickness.

The process was repeated by removing one layer of Kapton film from LDF1 and then applying DF3 to LDF1 with the dry film photoresist layers in contact to produce an assembly of stacked film designated as SDF2. SDF2 was laminated under the same conditions as for SDF1 above. This process was repeated two more times with DF4 and DF5 to form a laminated composite article designated as LDF4 consisting sequentially of a layer of Kapton 0.002 inch in thickness, a layer of dry film photoresist about 100 μm in thickness and a second layer of Kapton 0.002 inches in thickness. The thickness of the dry film photoresist layer of composite articles LDF1 through LDF4 was determined using micrometer measurements taken at 6 locations and these data are summarized in Table 9.

TABLE 9

Photoresist film thickness of the dry film photoresist of Example 10.

| Dry Film Resist | Photoresist Thickness in microns |
|---|---|
| LDF1 | 44 |
| LDF2 | 69 |
| LDF3 | 84 |
| LDF4 | 100 |

One piece of Kapton film was removed from LDF4 and then the dry film photoresist was laminated to a 100 mm diameter silicon wafer using the lamination and trimming process described in Example 8. The laminated photoresist film was processed image-wise to form a relief pattern using the procedure described in Example 9 with the exception that an exposure dose of 428 mJ/cm$^2$ was used due to the greater thickness of the resist film. The relief pattern showed good resolution of 40 micron line and space features.

Example 11

Multiple Lamination of Dry Film Resist to Form a Thick Dry Film Resist and Subsequent Lithographic Processing A dry film photoresist coating composition was prepared according to the formulary shown in Table 10.

TABLE 10

Formulary of the dry film photoresist composition of Example 11.

| Material | Type | Supplier | Weight Kg | Weight % Of Total |
|---|---|---|---|---|
| SU-8 Resin | Resin A | Resolution Performance Products | 34.02 | 47.58 |
| 2-Pentanone | Solvent D | Aldrich Chemical Company | 14.97 | 20.94 |
| 1,3-Dioxolane | Solvent D | Aldrich Chemical Company | 15.01 | 20.99 |
| Tone 0305 | Flexibilizer B | Dow Chemical Company | 3.97 | 5.55 |
| Cyracure 6974* | PAG C | Dow Chemical Company | 3.53 | 4.94 |
| Totals | | | 71.5 | 100.00 |

*The Cyracure 6974 used was a lot having 48.13 weight % of aryl sulphonium hexafluoroantimonate salts in propylene carbonate solvent.

The dry film photoresist composition was coated onto five pieces of 2 mil thick Mylar film using the coating and baking procedure of Example 6 to provide 5 pieces of dry film photoresist with a photoresist coating thickness of 20 microns which are designated for the purpose of this example as DF1, DF2, DF3, DF4, and DF5. DF1 and DF2 were then stacked together such that the photoresist layers were contacted together to produce an assembly of stacked films designated as SDF1. Assembly SDF1 was exposed to the action of heat and pressure by passing the structure through a Riston Laminating Machine using a pressure of 55 psi, a contact roller temperature of 85° C., and a roll speed of 0.3 meters/minute to form a laminated composite article designated as LDF1 consisting sequentially of a layer of Mylar 0.002 inches thick, a layer of dry film photoresist about 40 μm thick and a second layer of Mylar 0.002 inches thick. The process was repeated by removing one layer of Mylar film from LDF1 and then applying DF3 to LDF1 with the dry film photoresist layers in contact to produce an assembly of stacked film designated as SDF2. SDF2 was laminated under the same conditions as for SDF1 above. This process was repeated two more times with DF4 and DF5 to form a laminated composite article of dry film photoresist designated as LDF4 consisting sequentially of a layer of Mylar 0.002 inch in thickness, a layer of dry film photoresist with a thickness of 96 μm calculated as the average of six micrometer measurements, and a layer of Mylar 0.002 inch in thickness.

One piece of Mylar film was removed from LDF4 and then the dry film photoresist was laminated to a 100 mm diameter silicon wafer using the lamination and trimming process described in Example 8. The laminated photoresist film was processed image-wise to form a relief pattern using the procedure described in Example 9 with the exception that an exposure dose of 431 mJ/cm$^2$ was used due to the greater thickness of the resist film. The relief pattern showed good resolution of 15 to 50 micron line and space features

Example 12

Lamination of Two Coatings of Dry Film Resist on a Silicon Wafer Substrate

Two 5 inch by 5 inch pieces of the Dry Film Resist 3 of Example 7 were cut from the roll. Using the procedures described in Example 8, a 100 mm diameter silicon wafer substrate was coated with photoresist by lamination using one piece of dry film resist followed by removal of the Kapton web sheet. A second layer of dry film resist was then laminated to the coated wafer. After removal of the Kapton web material from the second coating, the thickness of the resist coating on the silicon wafer substrate was measured at nine locations and had an average thickness of 31.2 microns and a standard deviation of 0.61 microns. The laminated photoresist film was processed image-wise to form a relief pattern using the procedure described in Example 9. The relief pattern showed good resolution of 20 micron line and space.

COMPARATIVE EXAMPLES

Comparative Example 1

Dry Film Coating Composition not Containing Tone 0305 Polyol

A dry film photoresist composition was prepared by combining the components as shown in Table 11.

TABLE 11

Formulary of the dry film coating composition of Comparative Example 1.

| Material | Type | Supplier | Weight grams | Weight % Of Total |
|---|---|---|---|---|
| SU-8 Resin | Resin A | Resolution Performance Products | 2974.6 | 65.22 |
| 2-Pentanone | Solvent D | Aldrich Chemical Company | 652.2 | 14.30 |
| 1,3- | Solvent D | Aldrich Chemical Company | 652.2 | 14.30 |

TABLE 11-continued

Formulary of the dry film coating composition of Comparative Example 1.

| Material | Type | Supplier | Weight grams | Weight % Of Total |
|---|---|---|---|---|
| Dioxolane | | | | |
| Cyracure 6974* | PAG C | Dow Chemical Company | 282.0 | 6.18 |
| Total | | | 4561.0 | 100.0 |

*The Cyracure 6974 used was a lot having 48.13 weight % of aryl sulphonium hexafluoroantimonate salts in propylene carbonate solvent.

The components were weighed into a tared 4 liter amber glass round bottle. The bottle was sealed with a screw cap and the contents were mixed by rolling the bottle on a US Stoneware Model 755 RMV jar mill at ambient temperature for 12 hours. The resulting solution was transferred to a pressure vessel and the filled pressure vessel was connected to a Pall Corporation Sol-Vent 0.20 micron PTFE membrane filter cartridge. The pressure vessel was pressurized to 15 psi with dry nitrogen and the contents were filtered through the filter cartridge into 1.0 liter amber Boston Round bottles. The solution had a kinematic viscosity of 1622 centistokes measured at 25.0° C. with a size 450 Canon-Fenske viscometer tube. The composition had a total solids content of 68.31%. The content of Cyracure 6974 PAG is 4.56 weight % of SU-8 resin.

The dry film photoresist composition was coated on a 12 inch wide, 2.0 mil thick Kapton web using a commercial wire rod coating machine consisting of a wire rod coating module, a drying oven, and a winding module. A polyethylene cover sheet was applied at the winding module by hand feeding from a cover sheet supply roll. Although the dry film photoresist coating was substantially free of bubble coating defects, the dried film was brittle and showed substantial cracking and flaking when wound onto a 3 inch diameter roll core.

Comparative Example 2

Dry Film Coating Composition Containing Cyclopentanone Solvent

A dry film photoresist composition was made by combining calculated amounts of components as shown in Table 12.

TABLE 12

Formulary of the dry film coating composition of Comparative Example 2.

| Material | Type | Supplier | Weight grams | Weight % Of Total |
|---|---|---|---|---|
| SU-8 Resin | Resin A | Resolution Performance Products | 366.55 | 51.63 |
| Cyclopentanone | Solvent D | Rhodia | 262.01 | 36.91 |
| Tone 0305 | Flexibilizer B | Dow Chemical Company | 42.86 | 6.04 |
| Cyracure 6974* | PAG C | Dow Chemical Company | 37.79 | 5.32 |
| FC 171 | Surfactant | 3M Company | 0.69 | 0.10 |
| Total | | | 709.9 | 100 |

*The Cyracure 6974 used was a lot having 48.39 weight % of aryl sulphonium hexafluoroantimonate salts in propylene carbonate solvent.

The composition was coated on Kapton HN film according to the wire rod coating procedure of Example 6. After drying at 100° C. for 15 minutes, the coating was inspected and showed the presence of an extensive number of small bubbles throughout the coated area. The presence of these bubbles renders the coating unsuitable for lithographic applications because the bubbles may create defects in relief patterns.

While the invention has been described above with reference to specific embodiments thereof, it is apparent that many changes, modifications, and variation can be made without departing from the inventive concept disclosed herein. Accordingly, it is intended to embrace all such changes, modifications, and variations that fall within the spirit and broad scope of the appended claims. All patent applications, patents, and other publications cited herein are incorporated by reference in their entirety.

What is claimed is:

1. A photoimageable composition suitable for use as a negative photoresist comprising:
    (A) at least one epoxidized polyfunctional bisphenol A formaldehyde novolak resin;
    (B) at least one polycaprolactone polyol reactive diluent, wherein the amount of component (A) is from about 95% to about 75% by weight of the sum of (A) and (B) and the amount of component (B) is from about 5% to about 25% by weight of the sum of (A) and (B);
    (C) at least one photoacid generator in an amount from about 2.5 to about 12.5 parts per hundred parts of resin and reactive diluent, which initiates polymerization upon exposure to actinic radiation; and
    (D) a sufficient amount of solvent to dissolve (A), (B) and (C);
    wherein the solvent is selected from the group consisting of 2-pentanone and a mixture of 2-pentanone and 1,3-dioxolane in a weight ratio of from 1:3 to 3:1.

2. The photoimageable composition of claim 1 wherein the novolak resin (A) is an epoxidized polyfunctional bisphenol A formaldehyde novolak resin having an epoxide equivalent weight of about 195 to 230 gram/eq.

3. The photoimageable composition of claim 1 wherein reactive diluent (B) is a difunctional or trifunctional polycaprolactone polyol reactive diluent.

4. The photoimageable composition of claim 1 wherein the photoacid generator (C) is a triaryl sulfonium hexafluoroantimonate salt.

5. The photoimageable composition of claim 1 wherein the solvent (D) is a mixture of 2-pentanone and 1,3-dioxolane in a weight ratio from 2:1 to 1:2.

6. A layer of dry film photoresist composition made by coating a layer of photoresist compositions according to claim 1 onto a substrate and then removing at least some of the solvent from the coated layer, thereby forming a layer of dry film composition on the substrate.

7. A method of forming a dry film photoresist composite comprising the steps of: (1) applying the photoimagable composition of claim 1 to a polymer film substrate; (2) removing at least some of the solvent in the composition by heating the coated substrate thereby forming a substantially dry film of the photoresist composition on the polymer film substrate; and (3) applying a protective cover film to the opposite surface of the substantially dry film, thereby forming a dry film photoresist composite.

8. The method of claim 7 wherein the polymer film substrate selected from the group consisting of polyester film and polyimide film.

9. The method of claim 7 wherein the protective coating is a polyethylene film.

10. A method of forming a permanent photoresist pattern comprising the process steps of: (1) removing the protective coating from the dry film composite made according to claim 7, leaving the dry film layer of photoresist attached to the polymer film substrate; (2) laminating the dry film layer of photoresist to a second substrate; (3) removing the polymer film substrate from the laminated dry film layer of photoresist on the second substrate; (4) imagewise irradiating the coated second substrate with actinic or electron beam radiation; (5) crosslinking the irradiated areas of the dry film layer of photoresist by heating; (6) developing an image in the dry film layer with a solvent, thereby forming a negative relief image in the dry film photoresist layer; and (7) optionally crosslinking the developed relief image by heating.

11. The method of forming a photoresist pattern according to claim 10 where the actinic radiation is ultraviolet rays or X rays.

12. A cured imaged product of the dry film photoresist on the second substrate made according to claim 10.

13. The cured imaged product of claim 12, wherein the image aspect ratio is 1 to 100.

* * * * *